United States Patent
Hillman et al.

(10) Patent No.: US 7,839,157 B2
(45) Date of Patent: Nov. 23, 2010

(54) SURFACE MOUNT TESTING SYSTEM

(75) Inventors: Craig Damon Hillman, Bethesda, MD (US); Nathan John Blattau, Waldorf, MD (US); Danko Dmitrievich Priimak, Gaithersburg, MD (US)

(73) Assignee: DfR Solutions, LLC, College Park, MD (US)

(*) Notice: Subject to any disclaimer, the term of this patent is extended or adjusted under 35 U.S.C. 154(b) by 389 days.

(21) Appl. No.: 11/624,267

(22) Filed: Jan. 18, 2007

(65) Prior Publication Data

US 2008/0175298 A1    Jul. 24, 2008

(51) Int. Cl.
*G01R 31/02* (2006.01)
(52) U.S. Cl. .................. 324/760; 324/73.1; 219/482
(58) Field of Classification Search .......... 324/158.1, 324/719
See application file for complete search history.

(56) References Cited

U.S. PATENT DOCUMENTS

| | | |
|---|---|---|
| 5,451,885 A | 9/1995 | Birch et al. |
| 5,701,667 A | 12/1997 | Birch et al. |
| 5,718,628 A * | 2/1998 | Nakazato et al. ............ 454/184 |
| 6,181,556 B1 * | 1/2001 | Allman ....................... 361/690 |
| 6,262,392 B1 | 7/2001 | Morton et al. |
| 6,970,355 B2 * | 11/2005 | Ellsworth, Jr. et al. ...... 361/694 |

\* cited by examiner

*Primary Examiner*—Tu B Hoang
*Assistant Examiner*—Brian Jennison
(74) *Attorney, Agent, or Firm*—Capitol City TechLaw; Richard C. Irving (57) ABSTRACT

Embodiments may include a method and an apparatus for inducing degradation through temperature cycling of a solder joint or a component on a surface mount printed wiring board (SMPWB) coupon. The coupon may include alternating layers of dielectric material and conductive material stacked one upon another and a heating trace mounted on a surface of the SMPWB or between layers of dielectric material. A first value indicative of a temperature of the heating trace may be determined based on a measured electrical resistance of the heating trace. A difference between the first value and a second value indicative of a desired temperature of the heating trace may be determined. A particular current and a particular voltage may be applied to the heating trace based on the determined difference between the first value and the second value.

17 Claims, 7 Drawing Sheets

SURFACE MOUNT TESTING SYSTEM

BACKGROUND

Surface Mounted Technology (SMT) has been increasingly replacing through-hole mounting systems as component size reduction drives technological development. SMT involves use of flat pads on a surface of a printed wiring board (PWB), application of solder paste to the pads via a template, and application of components to the pads, wherein the components have leads which match the pads. The board may then be reflowed and the components soldered to the pads.

Most assembly failure occurs at interface points, namely within solder joints. For this reason, testing to determine life expectancy of an assembly has included analysis of thermal cycling on solder joints. As a result of testing involving thermal cycling, an expected lifetime of a device can be determined as well as identification of possible failure modes that may be corrected in order to extend the lifetime of the device.

Currently, thermal cycling of SMT solder joints includes immersing a PWB in an environment, such that heat is either absorbed or lost by the PWB. Typically, this is done by using oven-like chambers, which may perform temperature cycling in either a single chamber or dual chambers. In single chamber cycling, air within the chamber is incrementally heated. A rate of heating is known as a ramp rate. Once a desired ambient temperature is reached, the ambient temperature is stabilized while a temperature of the PWB lags due to thermal transference. The temperature within the chamber may then be dropped by applying a coolant or by a lack of heating.

In dual chamber thermal cycling, each chamber is regulated at a respective constant temperature and the PWB is physically moved from one chamber to another chamber in a process known as thermal shock. The process of thermal shock may include use of a gas, such as air or nitrogen, or liquids, such as fluoropolymers.

The current methods for performing thermal cycling for SMT connections has many disadvantages, such as, for example, cost, size and equipment complexity. Often, each item of equipment must be purchased separately, at great cost, and an end-user must custom design a configuration that meets space requirements and end-user requirements. Such a system tends to be unreliable, resulting in downtime. Although single chamber systems are less complex and more reliable than dual chamber systems, single chamber systems take up considerable space and are expensive to maintain.

In addition, both single chamber systems and dual chamber systems operate by heating an intermediate medium, such as air. In order to accommodate various sizes of devices, chambers are built with an excess of volume. Thus, for example, in order to heat a small device for testing, energy must be expended to heat an entire volume of a chamber.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In embodiments consistent with the subject matter of this disclosure, a surface mount printed wiring board coupon may be provided. The coupon may include alternating layers of dielectric material and conductive material stacked one upon another and a heating trace mounted on a surface of the coupon or between layers of dielectric material. In some embodiments, multiple heating traces may be mounted on the surface of the coupon or between layers of dielectric material, wherein each of the heating traces may be thermally isolated from others of the heating traces.

In other embodiments consistent with the subject matter of this disclosure, a method for inducing degradation of solder joints or components on a surface mount printed wiring board coupon may be provided. The coupon may include alternating layers of dielectric material and conductive material stacked one upon another and at least one heating trace mounted on a surface of the surface mount printed wiring board coupon or between layers of dielectric material. In the method, a first value indicative of a temperature of the heating trace may be determined based on a measured electrical resistance of the heating trace. A difference between the first value and a second value indicative of the desired temperature of the heating trace may be determined. A particular current and a particular voltage may be applied to the at least one heating trace based on the determined difference between the first value and the second value.

In other embodiments, an apparatus for inducing degradation of solder joints or components on a surface mount printed wiring board coupon may be provided. The coupon may include alternating layers of dielectric material and conductive material stacked one upon another, and at least one heating trace mounted on a surface of the coupon or between layers of dielectric. The apparatus may include a housing surrounding an area for mounting the surface mount printed wiring board coupon, at least one cooling component for cooling the surface mount printed wiring board coupon, and a controller module electrically connected to each of the at least one cooling component. The controller module may be arranged to be electrically connected to a portion of the surface mount printed wiring board coupon. The controller module may be configured to receive information indicative of a target temperature from a processing device, to monitor a value indicative of a temperature of the heating trace on the surface mount printed wiring board coupon, to apply an electrical current to the at least one heating trace of the surface mount printed wiring board coupon when the monitored value and the received information indicate that solder joints or the components of the surface mount printed wiring board coupon have a temperature lower than the target temperature.

DRAWINGS

In order to describe the manner in which the above-recited and other advantages and features can be obtained, a more particular description is described below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

Overview

Embodiments consistent with the subject matter of this disclosure may include a test coupon having alternating layers of dielectric material and conductive materials stacked one upon another. A heating trace may be mounted on a surface of the test coupon or between layers of dielectric material for heating an area. The heating trace may be constructed of copper in some embodiments. Further, in some embodiments, a second heat spreader or heating trace may be mounted on a surface of the test coupon or between other layers of dielectric material. The two heating traces may be placed such that they are thermally isolated from one another. The heating traces may be of a flat serpentine shape, a flat rectangular shape, or any other flat shape. Other embodiments may include more than two heating traces.

A Surface Mount Testing System (SMTS) may include a housing in which one or more test coupons may be placed for testing. A processing device such as, for example, a personal computer, or other processing device may be connected to a controller, which further is arranged to monitor a temperature of the heating trace of the test coupon by measuring an electrical resistance of the heating trace. Upon receiving data from the processing device, via a USB interface, or other interface, the controller may cause a heating trace to become heated when the monitored temperature of the heating trace is less than a desired temperature, as provided by the processing device. In some embodiments, a cooling component such as, for example, a fan, or other cooling component, may be activated when a desired temperature is less than the monitored temperature of the heating trace.

By heating the test coupon itself, via one or more heating traces, and cooling the test coupon with forced ventilation, either of ambient air or a cooling medium such as, for example, nitrogen or another medium, an amount of energy required per thermal cycle may be drastically reduced over an amount used by prior art methods. Further, an amount of space required for thermal testing of a test coupon may be greatly reduced.

Test Coupon

Figure 1:
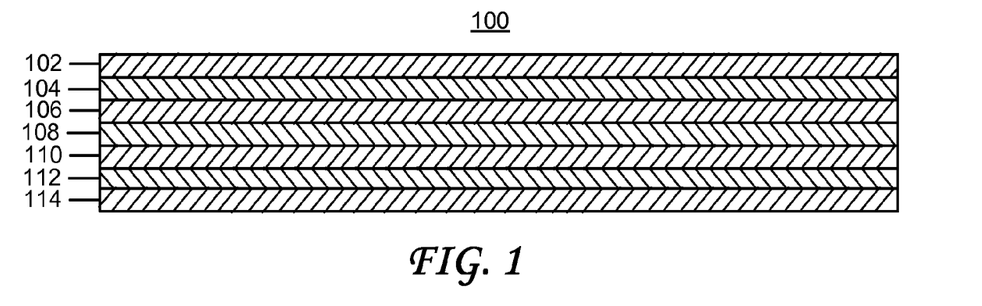
FIG. 1 illustrates multiple layers that may be included in an exemplary surface mount printed wiring board coupon.

FIG. 1 illustrates a side view of an exemplary test coupon 100, which may be used in embodiments consistent with the subject matter of this disclosure. Test coupon 100 may include alternating layers of dielectric material and conductive material stacked one upon another. For example, test coupon 100 may include conductive layers 102, 106, 110, and 114 and dielectric layers 104, 108 and 112. In one embodiment, the conductive layers may include copper, or other conductive material, and may have a thickness of about 35 microns. The dielectric material may include epoxy, ceramic polyimide, a glass resin substrate, or other insulating material, and in one embodiment may have a thickness of about 450 microns.

Figure 2:
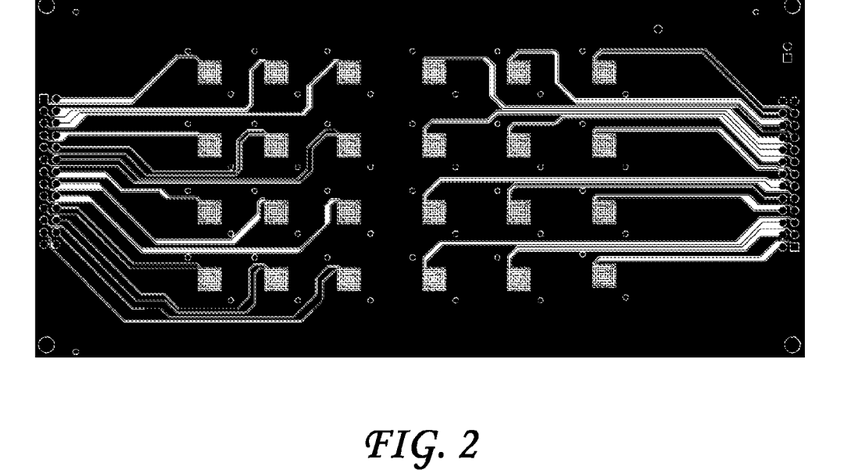
FIG. 2 illustrates a top view of an exemplary surface mount printed wiring board coupon.

FIG. 2 illustrates a top view of test coupon 100, showing conductive layer 102 having rectangular areas, where various components may be soldered.

Figure 3:
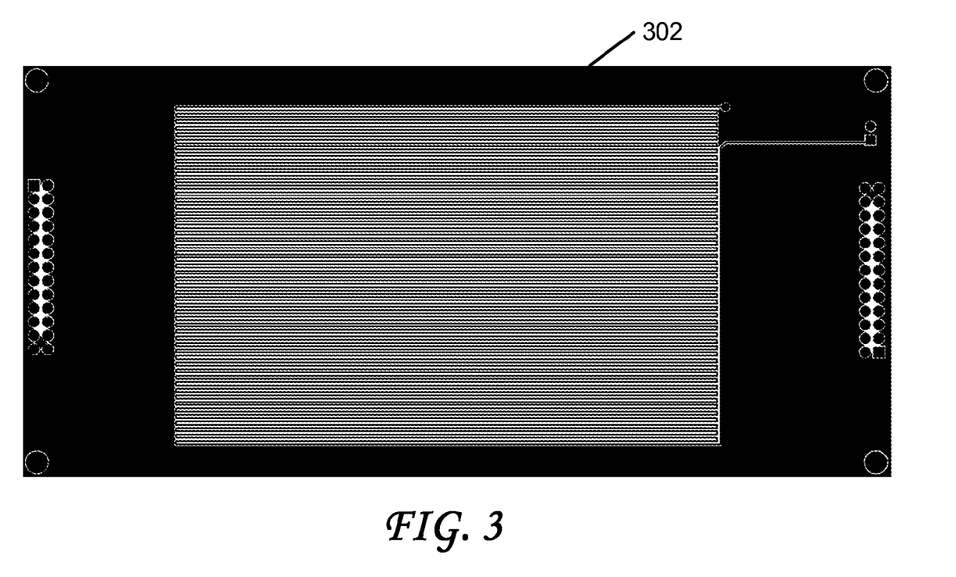
FIG. 3 illustrates an exemplary conductive layer of a surface mount printed wiring board coupon having a flat serpentine-shaped heating trace mounted thereon.

FIG. 3 illustrates a conductive layer, such as, for example, layer 106 or 110 having a flat serpentine-shaped heating trace mounted thereon. In one embodiment, the heating trace may be made from a conductive material such as, for example, copper, or other conductive material. In some embodiments, a heating trace or heat spreader may have a flat rectangular shape, or other flat shape. Further, some embodiments may have one heating trace and other embodiments may have two or more heating traces, each of which may be mounted on a surface of a test coupon or between layers of dielectric material of the test coupon.

Figure 4:
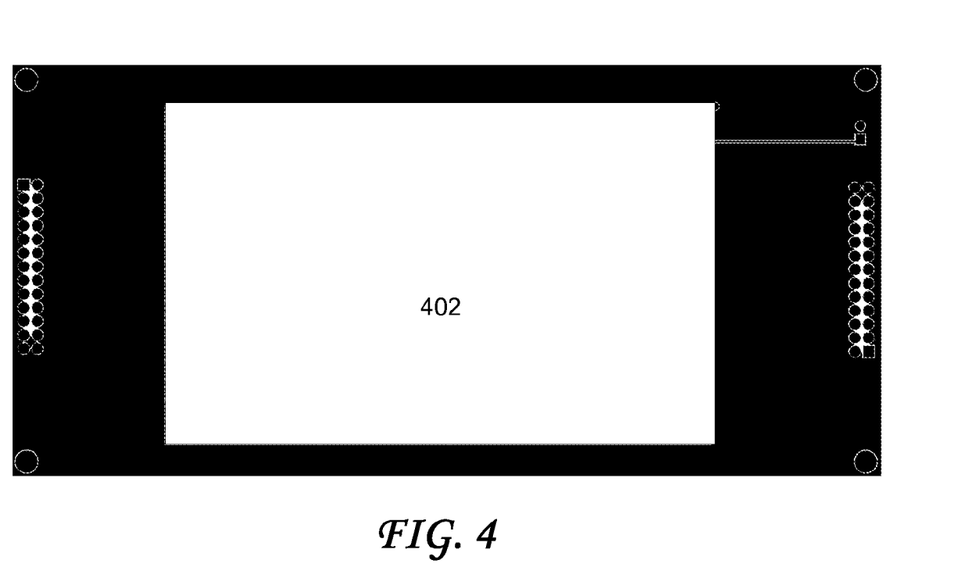
FIG. 4 illustrates an exemplary conductive layer of a surface mount printed wiring board coupon having a flat rectangular-shaped heat spreader.

FIG. 4 illustrates a bottom conductive layer, such as layer 114, of a test coupon having a flat rectangular-shaped heating element 402 mounted thereon. As previously mentioned, in other embodiments, a heating element may have a flat serpentine shape, or another flat shape, and may include copper or another conductive material.

Surface Mount Testing System

Figure 5A:
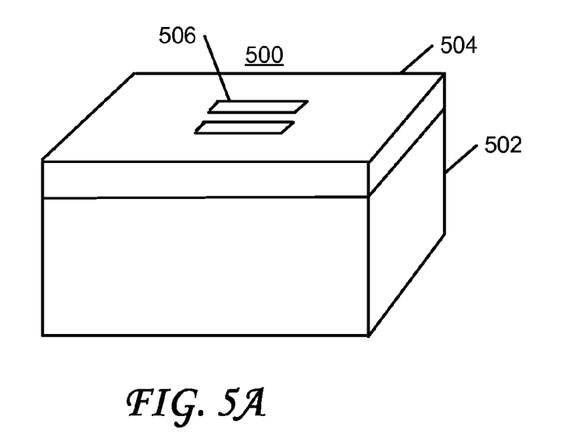
FIGS. 5A and 5B show an exemplary Surface Mount Testing System consistent with the subject matter of this disclosure.
Figure 5B:
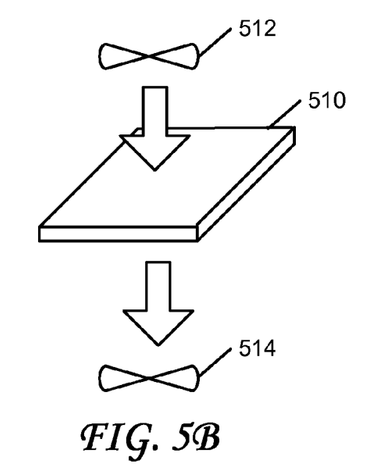

FIGS. 5A and 5B illustrate an exemplary Surface Mount Testing System (SMTS) 500. SMTS 500 may include a housing 502 and a removable housing lid 504, which may be removed for placing test coupons within the housing and removing test coupons from the housing. Housing lid 504 may include multiple vent openings 506 for cooling components such as, for example, fans or other cooling components. A bottom portion of housing 502 may also include multiple vent openings (not shown) for cooling components.

FIG. 5B illustrates a surface mount printed wiring board 510 which may be mounted within housing 502. Surface mount printed wiring board 510 may be mounted within an area surrounded by housing 502 of SMTS 500 via a number of techniques including, but not limited to, standoffs, edge card guides, wedge locks, or edge clamps. Fan 512 may be included in a cooling assembly located below vent openings 506 of housing lid 504 for blowing cold air toward surface mount printed wiring board 5 10. Fan 514 may be included in a cooling assembly located above the vent openings (not shown) at a bottom portion of housing 502 for blowing air out of housing 502.

SMTS 500 is an exemplary embodiment. In other embodiments, multiple surface mount printed wiring boards may be mounted within a housing. For example, in one embodiment, six surface mount printed wiring boards may be mounted in two rows of three boards each. A cooling assembly may be positioned above and below each of the surface mount printed wiring boards to cool respective surface mount printed wiring boards. In other embodiments, other configurations may be implemented.

Figure 6A:
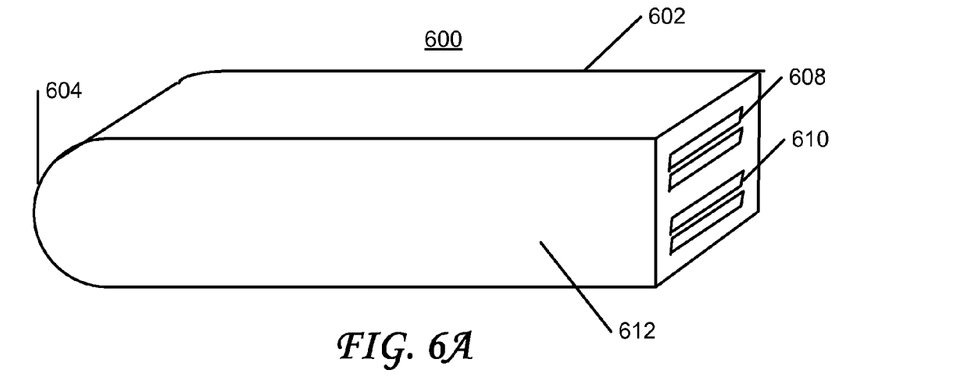
FIGS. 6A-6C show another embodiment of an exemplary Surface Mount Testing System consistent with the subject matter of this disclosure.
Figure 6B:
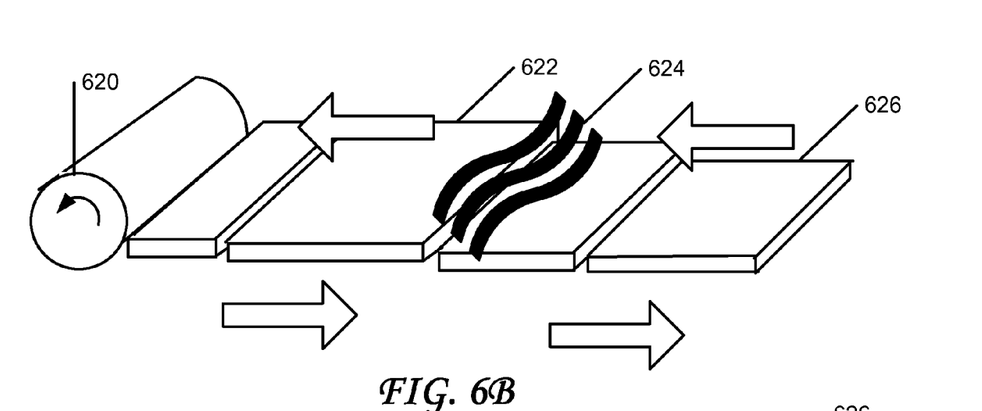
Figure 6C:
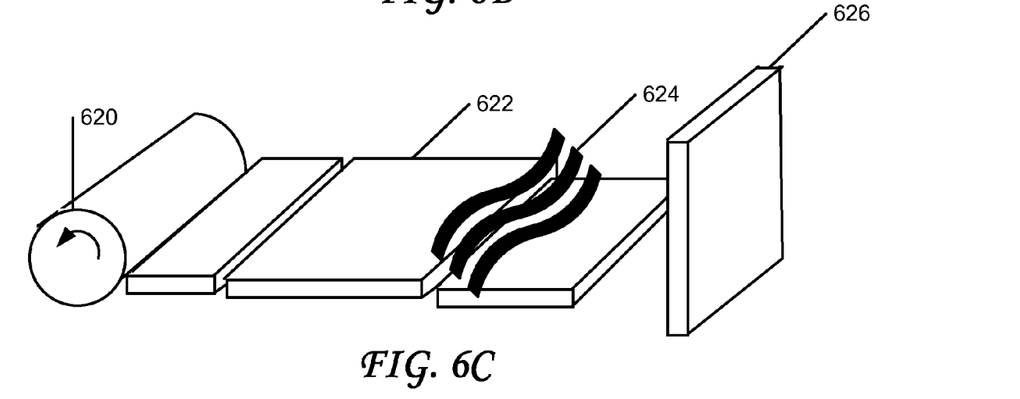

FIGS. 6A-6C illustrate a second exemplary SMTS 600. SMTS 600 may include a housing 602, which may have an arced end 604 and a vented end 606 having intake vents 608 and outgoing vents 610. Housing 602 may be constructed of a plastic material in some embodiments and may have a low height. SMTS 600 may include a front portion 612 which may be opened or removed for inserting or removing a surface mount printed wiring board for testing. Although exemplary housing 602 includes arced end 604, in other embodiments, housing 604 may have an arced end internally and may not have an arced shape externally.

FIG. 6B shows a portion of SMTS 600 without housing 602 so that internal components may be viewed. SMTS 600 may include a fan 620, a printed circuit board 622, an evaporator 624, and a rotating deflector 626, which may be electrically controlled in some embodiments.

Fan 620 may be a cross flow fan to create a wide, uniform flow of air or other cooling medium. Printed circuit board 622 may be mounted within housing 602 of SMTS 600 via a number of techniques including, but not limited to, standoffs, edge card guides, wedge locks, or edge clamps. Deflector 626 is shown in an open position in FIG. 6B to encourage maximum flow of air or other cooling medium through vents 608 and 610. Deflector 626 may be in a closed position (FIG. 6C) when cooling solder joints or components of printed circuit board 622 are below room temperature. In the closed position, deflector 626 may block off vents 608 and 610 and may recirculate the cooling medium. As shown in FIG. 6B, in this embodiment, the air or other cooling medium may flow laterally across printed circuit board 622, in one direction above printed circuit board 622, and laterally in another direction below printed circuit board 622.

Although not explicitly shown, a controller may be electrically connected to one or more heating traces on a test coupon, such as, for example, surface mount printed wiring board 510 mounted within housing 502, or surface mount printed wiring board 622 mounted within housing 602, such that the controller may cause an electrical current to be passed through the one or more heating traces to heat the one or more heating traces. An electrical resistance of the one or more heating traces may be measured to provide an indication of temperature. In embodiments consistent with the subject matter of this disclosure, an electrical resistance of the one or more heating traces may be in a range of 40-60 ohms at a temperature of 20° C.

Figure 7:
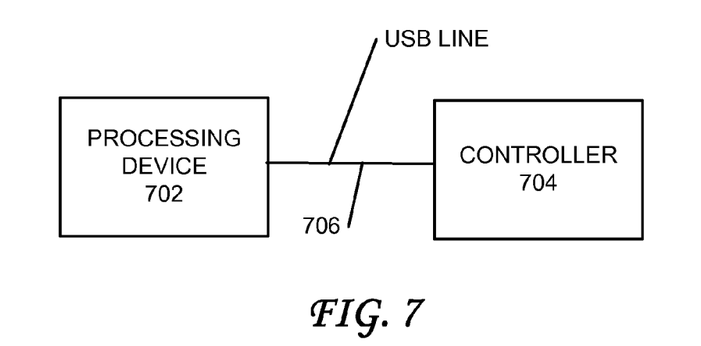
FIG. 7 illustrates an exemplary processing device and an exemplary Surface Mount Testing System controller, which may be used in embodiments consistent with the subject matter of this disclosure.

FIG. 7 illustrates a processing device 702 and an SMTS controller 704 of an SMTS, such as, for example, SMTS 500 or 600. Processing device 702 may be a server, a desktop personal computer, a notebook personal computer, a handheld processing device, or other processing device. Controller 704 may be a controller for monitoring electrical resistance of one or more heating traces on a surface mount printed wiring board test coupon and for sending an electrical current to the one or more heating traces to cause the one or more heating traces to heat up.

Figure 8:
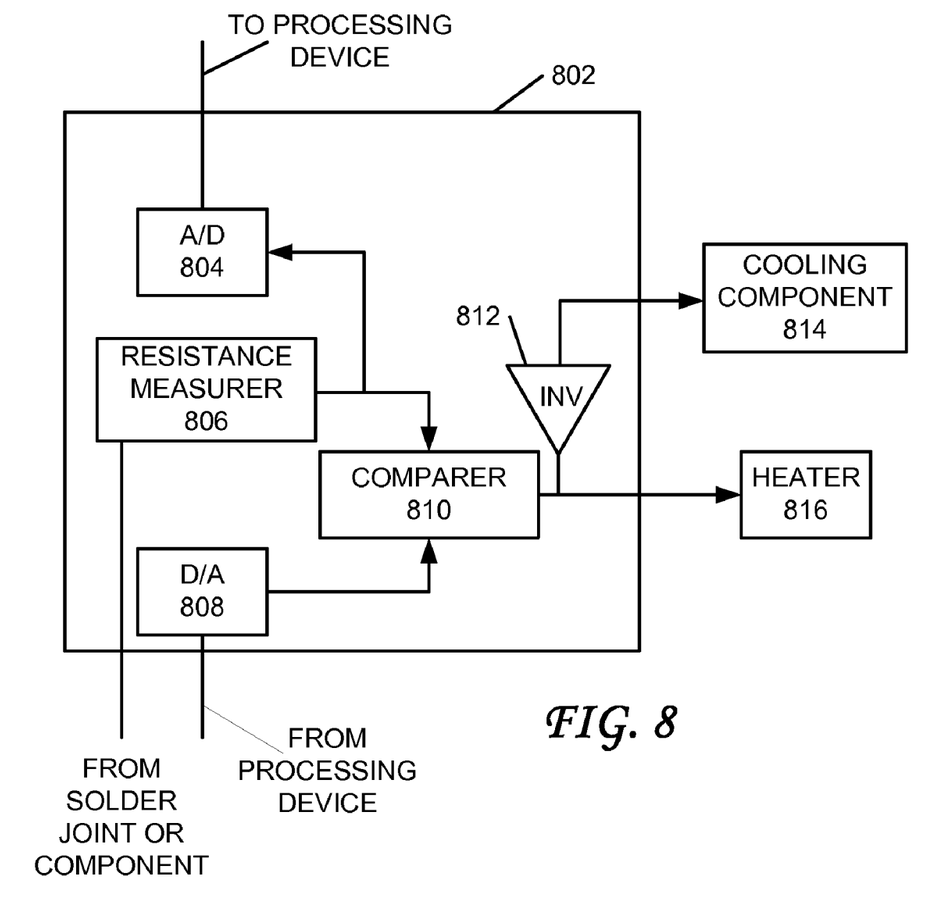
FIG. 8 shows a more detailed view of the exemplary Surface Mount Testing System controller of FIG. 7.

FIG. 8 illustrates an exemplary controller 802, which may be used in embodiments consistent with the subject matter of this disclosure. Controller 802 may include an analog-to-digital (A/D) converter 804, a resistance measurer 806 a digital-to-analog (D/A) converter 808, a comparer 810, and an inverter 812.

D/A converter 808 may receive a signal from a processing device such as, for example, processing device 702, indicative of a desired temperature. In some embodiments, the signal may represent an electrical resistance value. An analog version of the signal may be provided to comparer 810. Resistance measurer 806 may cause an electrical current to be passed through at least one heating trace of a test coupon, such that an electrical resistance of the at least one heating trace may be determined. An indication of the electrical resistance may be provided to comparer 810 and to A/D converter 804, which may provide a digital version of the measured electrical resistance to processing device 702. Comparer 810 may compare values representing the measured electrical resistance and the desired temperature (or electrical resistance) and may provide a value representing a difference of the compared values to a heater 816, which in some embodiments may be the one or more heating traces. The value representing the difference of the compared values may also be provided to an inverter 812 which may provide the inverted difference to a cooling component 814, which in some embodiments may be one or more fans, or other cooling components.

In one embodiment consistent with the subject matter of this disclosure, controller 802 may be powered by an alternating current source. In such an embodiment, when a current is to be applied to one or more heating traces, or to one or more cooling components, the current may be applied only during a positive portion of a sinusoidal period of the provided electrical current. When a current is to be applied to the one or more heating traces in order to monitor electrical resistance, the current may be applied to the one or more heating traces and the electrical resistance determined only during a negative portion of the sinusoidal period of the provided electrical current.

Exemplary Processing System

Figure 9:
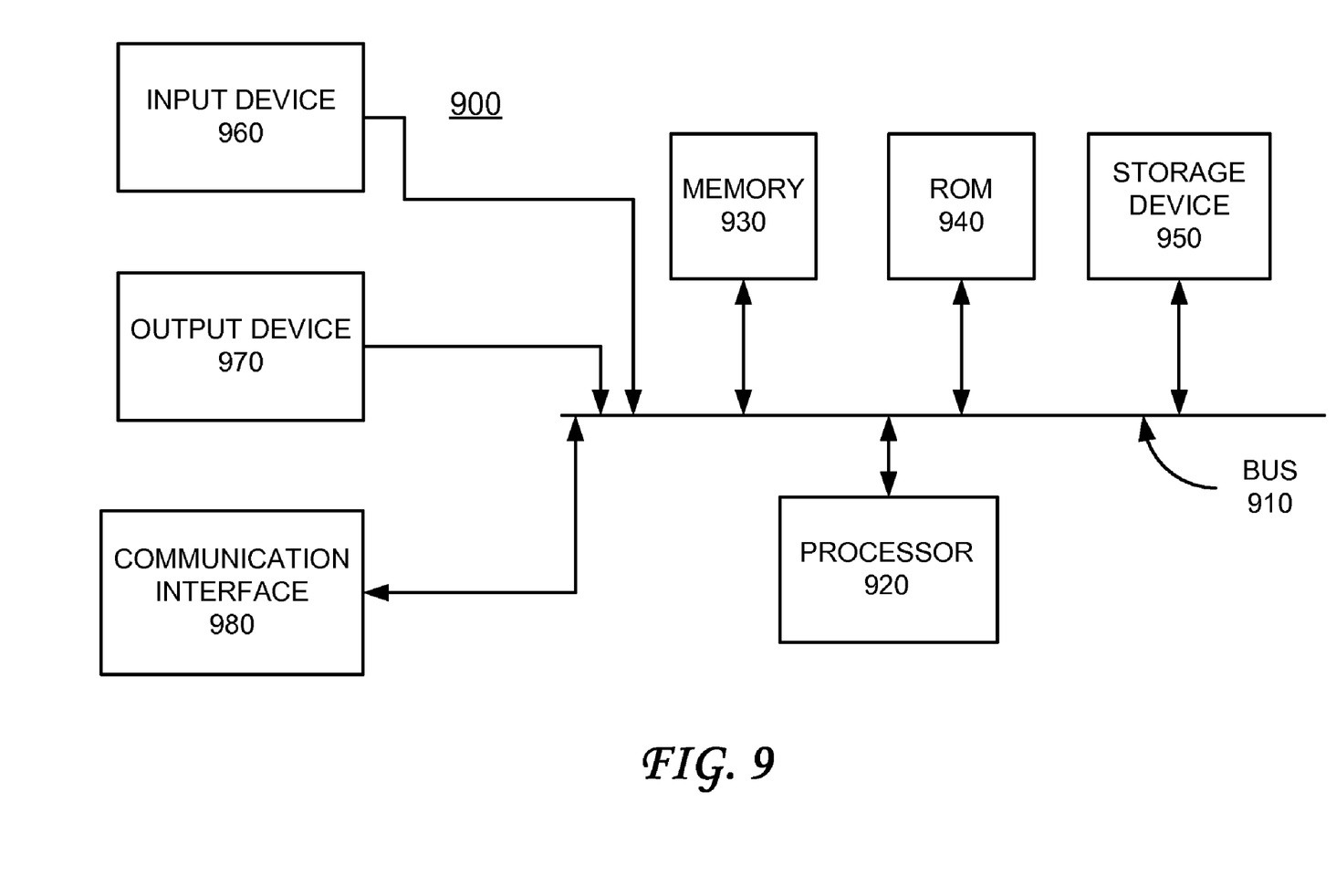
FIG. 9 illustrates a functional block diagram of an exemplary processing system, consistent with subject matter of this disclosure.

FIG. 9 illustrates a functional block diagram of an exemplary processing device 900, which may be used to implement embodiments consistent with the subject matter of this disclosure. In one embodiment, processing device 900 may be used to implement processing device 702. Processing device 900 may include a bus 910, a processor 920, a memory 930, a read only memory (ROM) 940, a storage device 950, an input device 960, an output device 970, and a communication interface 980.

Bus 910 may permit communication among components of processing system 900. Processor 920 may include at least one conventional processor or microprocessor that interprets and executes instructions. Memory 930 may be a random access memory (RAM) or another type of dynamic storage device that stores information and instructions for execution by processor 920. Memory 1330 may also store temporary variables or other intermediate information used during execution of instructions by processor 920. ROM 940 may include a conventional ROM device or another type of static storage device that stores static information and instructions for processor 920. Storage device 950 may include any type of media, such as, for example, flash memory, Non-Volatile Random Access Memory (NVRAM), magnetic or optical recording media and its corresponding drive or port.

Input device 960 may include one or more conventional mechanisms that permit a user to input information to processing system 900, such as a keyboard, a mouse, a pen, a stylus, a voice recognition device, a microphone, a headset, etc. Output device 970 may include one or more conventional mechanisms that output information to the user, including a display, a printer, one or more speakers, a headset, etc. Communication interface 980 may include any transceiver-like mechanism that enables processing system 900 to communicate with other devices or networks. In one embodiment, communication interface 980 may communicate to a controller via a USB interface. In other embodiments, another type of interface may be employed.

Processing system 900 may perform such functions in response to processor 920 executing sequences of instructions contained in a tangible machine-readable medium, such as, for example, memory 930, a magnetic disk, an optical disk, or other medium. Such instructions may be read into memory 930 from another machine-readable medium, such as storage device 950, or from a separate device via communication interface 980.

Exemplary Processing

Figure 10:
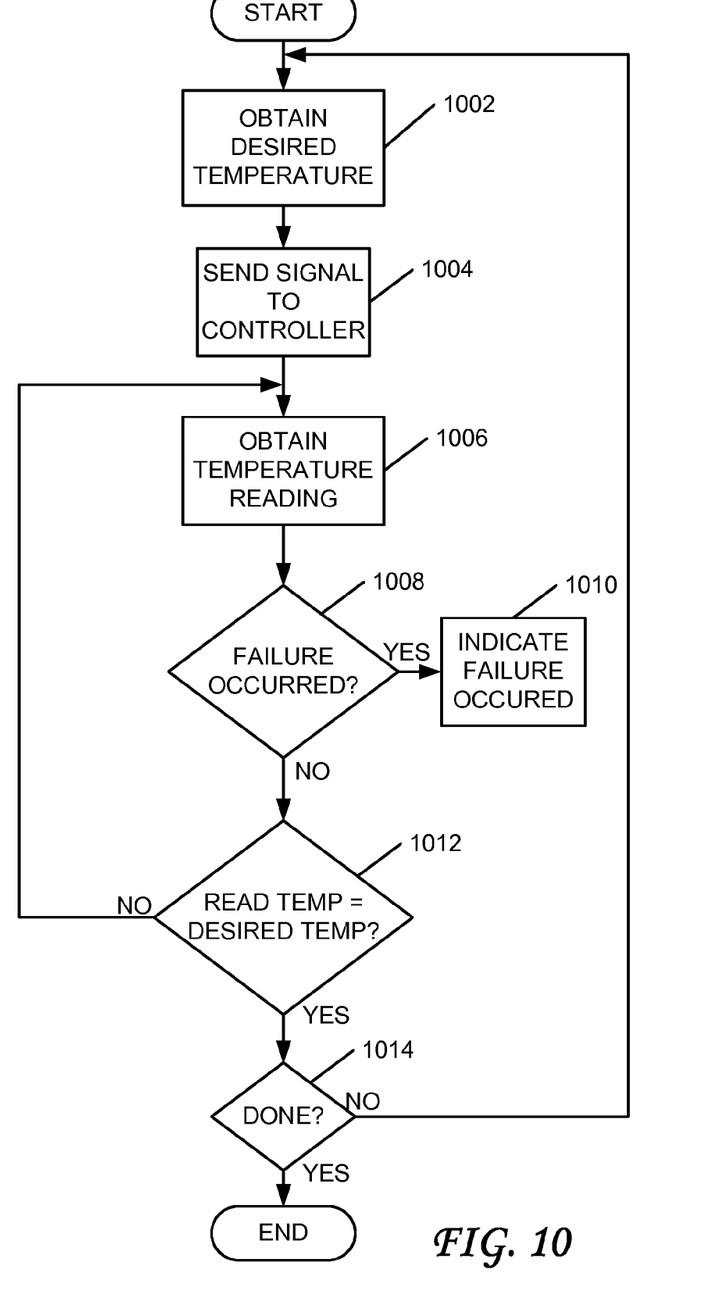
FIG. 10 is a flowchart illustrating an exemplary process that may be performed in embodiments consistent with the subject matter of this disclosure.

FIG. 10 is a flowchart illustrating an exemplary process that may be performed in embodiments consistent with subject matter of this disclosure. The process may begin with a processing device such as, for example, processing device 900, obtaining a value indicative of a desired temperature (act 1002). The value may be included as data in an executing program of processing device 900, or the data may be provided from a database, or from another input source. In some embodiments, the value may be an electrical resistance value, which may be indicative of the desired temperature. Next, processing device 900 may send a signal, indicative of the desired temperature, to D/A converter 808 (act 1004).

After resistance measurer 806 measures the electrical resistance from the at least one heating trace, the measured electrical resistance may be provided to A/D converter 804, which may further provide a digital version of the measured electrical resistance to processing device 900. Thus, processing device 900 obtains a value indicative of a temperature of the at least one heating trace (act 1006). Processing device 900 may then examine the received value indicative of the temperature and may determine whether a failure occurred (act 1008). In one implementation a failure may be determined when the received value indicative of the temperature is an unexpected value. If processing device 900 determines that a failure occurred, then processing device 900 may provide an indication of the failure (act 1010). The indication of the failure may be provided in a number of different ways including, but not limited to, sounding an alarm, displaying a message, sending an e-mail or other communication to a designated party, or other notification means.

Next, if processing device 900 determined that a failure did not occur, then processing device 900 may determine whether the obtained value indicative of the temperature indicates that the temperature is the desired temperature (act 1012). If the temperature is not the desired temperature, then processing device 900 may repeat acts 1006 through 1012. If processing device 900 determined that the temperature is the desired temperature, in act 1012, then processing device 900 may determine whether there are any additional steps to be performed during thermal cycle stress testing (act 1014). If additional steps are to be performed, then processing device 900 may repeat acts 1002 through 1014, thereby causing a temperature change based on an obtained value indicative of a desired temperature and a measured value indicative of the temperature.

By heating and monitoring the temperature of at least one heating trace of the surface mount printed wiring board test coupon, such that the heat is applied at a programmed rate, a SMTS may control a ramp rate of heating while applying a voltage to one or more heating traces. Further, the SMTS may be used to maintain the surface mount printed wiring board test coupon at a constant temperature while monitoring for an occurrence of a failure.

CONCLUSION

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above description may contain specific details, they should not be construed as limiting the claims in any way. Other configurations of the described embodiments are part of the scope of this disclosure. Further, implementations consistent with the subject matter of this disclosure may have more or fewer acts than as described, or may implement acts in a different order than as shown. Accordingly, the appended claims and their legal equivalents should only define the invention, rather than any specific examples given.

We claim as our invention:

1. A method for inducing degradation of a solder joint on a surface mount printed wiring board coupon including alternating layers of dielectric material and conductive material stacked one upon another, and a heating trace, connected to the solder joint, and mounted on a surface of the surface mount printed wiring board coupon or between layers of the dielectric material, the method comprising:
    measuring a first value indicative of a temperature of the heating trace connected to the solder joint;
    applying a particular current and a particular voltage to the heating trace connected to the solder joint when the temperature indicated by the first value is determined not to be equal to a desired temperature; and
    continuing both the measuring of the first value and the applying of the particular current and the particular voltage only while the temperature indicated by the measured first value is determined not to be equal to the desired temperature; and
    determining whether additional steps are to be performed when the measured first value is indicative of the temperature of the heating trace being equal to the desired temperature.

2. The method of claim 1, wherein:
    the measuring of the first value is performed at periodic time periods, and
    the applying of the particular current and the particular voltage to the heating trace is performed only when the desired temperature is higher than the temperature indicated by the first value.

3. The method of claim 2, further comprising turning on a fan to cool the surface mount printed wiring board only when the temperature indicated by the first value is higher than the desired temperature.

4. The method of claim 1, further comprising:
    controlling a ramp rate of heating while applying a current and a voltage to the at least one heating trace.

5. The method of claim 1, further comprising:
    maintaining the surface mount printed wiring board at a constant temperature.

6. An apparatus for detecting degradation through temperature cycling of a solder joint on a surface mount printed wiring board coupon including alternating layers of dielectric material and conductive material stacked one upon another and a heating trace connected to the solder joint, the heating trace being mounted on a surface of the surface mount printed wiring board coupon or between layers of the dielectric material, the apparatus comprising:

a housing surrounding an area for mounting the surface mount printed wiring board coupon;

at least one cooling component for cooling the surface mount printed wiring board coupon; and a controller module comprising:
  a digital-to-analog converter arranged to receive digital information indicative of a target temperature from a processing device and to convert the digital information to analog information indicative of the target temperature,
  a resistance measurer arranged to measure a first value indicative of a temperature of the heating trace connected to the solder joint,
  a comparer arranged to compare the first value indicative of the temperature of the heating trace with the analog information indicative of the target temperature and to produce an analog signal having a second value representing a difference of the first value and the analog information indicative of the target temperature, the comparer being electrically connected to each of the at least one cooling component and the heating trace so as to provide the analog signal representing the difference to the heating trace or an inverted analog signal representing an inverted value of the difference to the at least one cooling component, and
  an analog-to-digital converter arranged to convert a second analog signal, representing the first value from the resistance measurer, to a digital signal and to provide the digital signal to the processing device.

7. The apparatus of claim 6, wherein the controller is configured to cause one of the at least one cooling component to turn on to cool the surface mount printed wiring board coupon when the received digital information and the measured first value indicate that the heating trace has a temperature higher than the target temperature.

8. The apparatus of claim 6, wherein:
  the analog signal representing the difference includes an electrical current, and
  when the comparer provides the electrical current to the heating trace, the comparer provides the electrical current only during a positive portion of a cycle of an alternating current power source.

9. The apparatus of claim 6, wherein when the resistance measurer measures the first value indicative of the temperature of the heating trace, the resistance measurer measures the first value only during a negative portion of a cycle of an alternating current power source.

10. The apparatus of claim 6, wherein when the at least one cooling component is on, the at least one cooling component cools by forcing ambient air in a direction of the surface mount printed wiring board coupon.

11. The apparatus of claim 6, wherein the resistance measurer is arranged to measure the first value indicative of the temperature of the heating trace by measuring an electrical resistance of a current passed through the heating trace.

12. The apparatus of claim 6, wherein the at least one cooling component includes a cross flow fan for creating a flow of a cooling medium laterally across a surface of the surface mount printed wiring board coupon.

13. The apparatus of claim 12, further comprising an evaporator, wherein
  the cross flow fan is arranged to cause the cooling medium to flow laterally through the evaporator before flowing across the surface of the surface mount printed wiring board coupon.

14. The apparatus of claim 13, further comprising a movable deflector, wherein:
  when the movable deflector is in an open position, the cooling medium flows through a vent in the housing past the movable deflector, through the evaporator, and laterally across the surface of the surface mount printed wiring board coupon, and
  when the movable deflector is in a closed position, the deflector blocks the vent in the housing and the cooling medium is recirculated within the housing.

15. The apparatus of claim 6, wherein the at least one cooling component includes a first fan positioned above the surface mount printed wiring board coupon and arranged to blow a cooling medium directly toward the surface mount printed wiring board coupon, and a second fan positioned below the surface mount printed wiring board coupon and arranged to direct the cooling medium away from the surface mount printed wiring board coupon.

16. The apparatus of claim 12, wherein the cooling medium is nitrogen.

17. The apparatus of claim 6, wherein the housing completely surrounds the area for mounting the surface mount printed wiring board coupon.

* * * * *